United States Patent [19]

Choi

[11] Patent Number: 5,079,506
[45] Date of Patent: Jan. 7, 1992

[54] CHECKING CIRCUIT FOR CHECKING THE NORMAL OPERATION OF A SENSOR

[75] Inventor: Jin-Kyu Choi, Suwon, Rep. of Korea

[73] Assignee: Samsung Electronics Co., Ltd., Suwon, Rep. of Korea

[21] Appl. No.: 415,563

[22] Filed: Oct. 2, 1989

[51] Int. Cl.$^5$ ............................................. G01R 31/02
[52] U.S. Cl. ..................................... 324/549; 324/705
[58] Field of Search ................................ 324/704–706, 324/525, 537, 538, 549, 555; 340/652, 653, 655; 374/142

[56] References Cited

U.S. PATENT DOCUMENTS

| | | | |
|---|---|---|---|
| 2,995,703 | 8/1961 | Rogers | 324/537 X |
| 3,590,370 | 6/1971 | Fleischer | 324/537 |
| 4,342,957 | 8/1982 | Russell | 324/538 X |
| 4,841,286 | 6/1989 | Kummer | 324/537 X |

FOREIGN PATENT DOCUMENTS 60-18006  5/1985  Japan.

Primary Examiner—Jack B. Harvey
Attorney, Agent, or Firm—Sterne, Kessler, Goldstein & Fox

[57] ABSTRACT

A checking circuit for checking the normal operation of a sensor comprising a sensor, a controller for switching the checking circuit operation between an open check mode and a sensing mode. The circuit for effecting the open check mode is responsive to a first logical output signal from the controller. The circuit for effecting the sensing mode is responsive to a second logical output signal from the controller, however, the sensing is only accomplished after successful completion of the open check mode.

4 Claims, 3 Drawing Sheets

CHECKING CIRCUIT FOR CHECKING THE NORMAL OPERATION OF A SENSOR

BACKGROUND OF THE INVENTION

1. Field of the Invention

The present invention relates to an open check circuit for sensor applications. The open check circuit can be implemented in a sensor-adapted thermometer, a hygrometer or a heating apparatus for use in home and industry, as well as home appliances such as electric cookers, electric refrigerators, air conditioners, and humidifiers in which sensors are commonly used.

2. Description of the Prior Art

In general, the conventional sensing circuit is comprised of a fixed circuit, i.e., voltage divider circuit having a resistor and a sensor, or a voltage divider and an operational amplifier. In this circuit, as the variation range of the sensing grows larger, the performance of the open check becomes more difficult.

In Japanese patent Laid-open Gazette No. SHO 60-18006 is disclosed a temperature-sensing circuit which has wide hysteresis characteristics in which a thermal sensor such as thermistor is used. When the sensor is set to a level above the predetermined value of the resistor, the input value of the controller will be saturated. In this case, it cannot determine whether the operation of the sensing circuit is in a normal state, or an abnormal state where the sensor is defective.

Furthermore, when an open check for a sensor cannot be effected, the system will continue to operate even in the absence of the sensor. Thus, fatal damage to the system results due to the malfunction of a sensing circuit. Consequently, the open check for a sensing circuit should always be required.

SUMMARY OF THE INVENTION

It is the object of the present invention to eliminate problems that lead to the system failure.

The invention achieves the foregoing by providing an open check circuit having a different circuit configuration between the open check mode and the sensing mode; wherein the open check always precedes the sensing mode and the normal sensing mode is effected only if the sensing circuit is proved to be in a normal operation state.

In a preferred embodiment of the invention, the open check circuit is comprised of a controller which switches between an open check mode and a sensing mode. A circuit for effecting the open check mode utilizes a first logical output signal from the controller. A circuit for effecting the sensing mode after completion of the open check uses a second logical output signal from the controller.

According to one aspect of the present invention, the circuit for the open check includes a first and second resistor connected in series to reference potential and the open check is effected by turning on transistor Q3. The circuit for effecting the sensing mode is configured such that transistors Q1, Q2 are turned on for sensing mode. This circuit also includes a first and second resistor connected in series with the sensor, and a third resistor connected in parallel with the sensor and hooked to a reference potential.

DESCRIPTION OF THE DRAWINGS

For a better understanding of the invention, reference may be made to the accompanying drawings, in which.

DESCRIPTION OF THE PREFERRED EMBODIMENT

Figure 1:
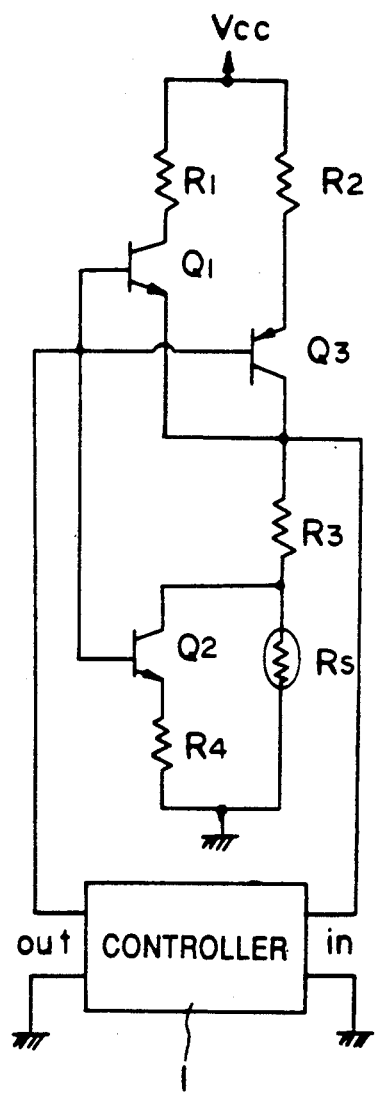
FIG. 1 is a schematic circuit diagram of one embodiment of the circuit according to the invention.

FIG. 1 shows the configuration of a circuit according to the invention. The circuit includes transistors Q1 and Q2 for switching the circuit in sensing mode and transistor Q3 for switching the circuit in open check mode. The base of transistors Q1, Q2 and Q3 are connected together and are hooked to the output terminal of controller 1 for switching the operation between the open check mode and the sensing mode.

Voltage divider resistor R1 for the sensing mode and resistor R2 for the open check mode have their first ends connected to the operating voltage Vcc, while the second ends of the resistors R1 and R2 are connected to the collector of transistor Q1 and the emitter of transistor Q3, respectively. The emitter of transistor Q1, the collector of transistor Q3 and one terminal of resistor R3 are all connected to the input terminal of the controller 1. The resistor R3 is designed to limit the operating range of the sensing resistor, or sensor RS, and to allow for the linearity of the sensor. The other terminal of resistor R3 is connected to a common connection of the collector of transistor Q2 and one terminal of sensor RS. The emitter of transistor Q2 is connected, via a resistor R4, to reference potential as is the other terminal of sensor RS. Resistor R4 has the same function as resistor R3 (i.e., limit the operating range of RS).

The controller 1 is designed to always produce a "low" signal at its output terminal before receiving sensing value of this circuit and to open-check the sensor, and if the sensor is not defective, permit the circuit to enter a normal sensing mode.

Figure 2:
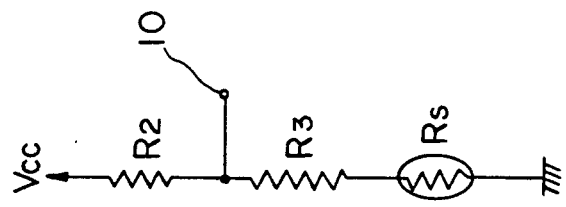
FIG. 2 is a circuit diagram when the circuit of FIG. 1 is in the open check mode.

When the "low" signal appears at the output terminal of the controller, the circuit enters into the open-check mode for the sensor. Then the base of transmitters Q1, Q2 are applied with the "low" signal, and therefore transistors Q1 and Q2 are turned off and only transistor Q3 is turned on. In this open check mode, as shown in FIG. 2, a divider resistor R2, a limiter resistor R3, and a sensing resistor RS will substantially constitute a circuit for effecting the open-check mode. With this circuit, resistor R2 is set to high value and resistor R3 is set to a relatively low value in order to permit the sensor RS to sense a value of high range. In addition, since the common connection of resistors R2 and R3 is connected to the input of controller 1, and the values of resistors R2 and R3 are to offset the input of controller 1, the voltage value divided from the divider resistor R2 and the sensor resistor R2 will be supplied to the input of controller 1. More specially, the reason of higher value of resistor R2 relative to resistor R3 is that the value of sensor RS can be determined such that:

$$\frac{RS \cdot Vcc}{RS + R2}$$

Since the value of sensor RS is established as a value of the input of the controller 1, if the value of resistor R2 is too small, the value of sensor approaches to the operating voltage Vcc, and this will appear at the input of controller. Thus, the controller 1 is operative independent of the operation of sensor RS and the circuit would operate as if the sensor were omitted. Accordingly, the value of resistor R2 should be adjusted to properly determine the sensing characteristics of the sensing resistor RS.

On the other hand, when the controller 1 determines that the sensor RS is not defective according to such input value of the circuit for open-check mode, the controller 1 will produce a "high" signal at its output terminal for entering into sensing mode.

Figure 3:
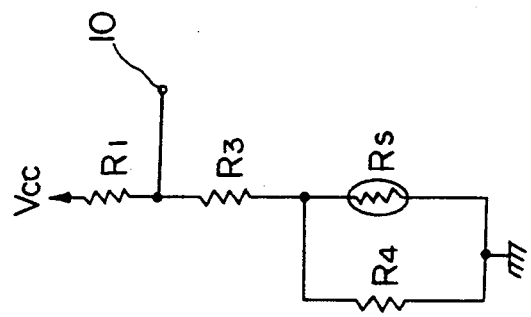
FIG. 3 is a circuit diagram when the circuit of FIG. 1 is in the sensing mode.

In the sensing mode, the base of NPN transistors Q1, Q2 are supplied the "high" signal, and are thus turned on, while PNP transistor Q3 is turned off. Thus, as shown in FIG. 3, a divider resistor R1, on limiter resistors R3 and R4, and a sensing resistor RS substantially constitute a circuit for effecting the sensing mode. With the circuit of FIG. 3, resistor R1 is set to small value in order to allow sensor RS to sense the low range value. Thus, the voltage value divided from the respective resistors R1, R3, R4 and RS will be supplied to the input terminal of controller 1 and the circuit will operate in normal sensing mode.

Figure 6:
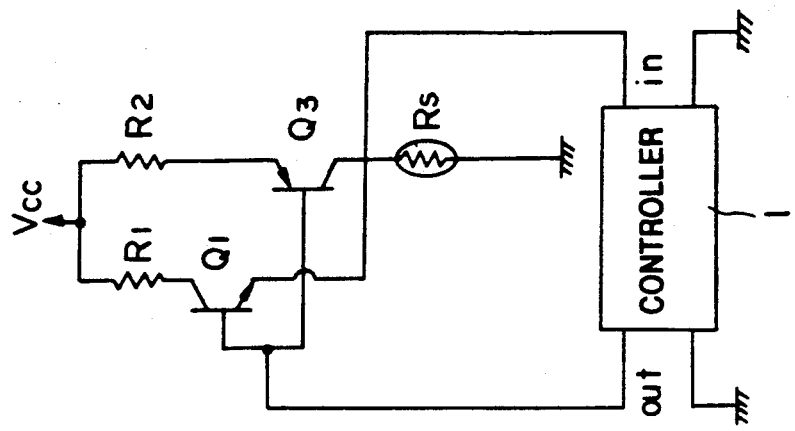
FIG. 6 is a schematic circuit diagram of still a further embodiment of the circuit according to the invention.
Figure 5:
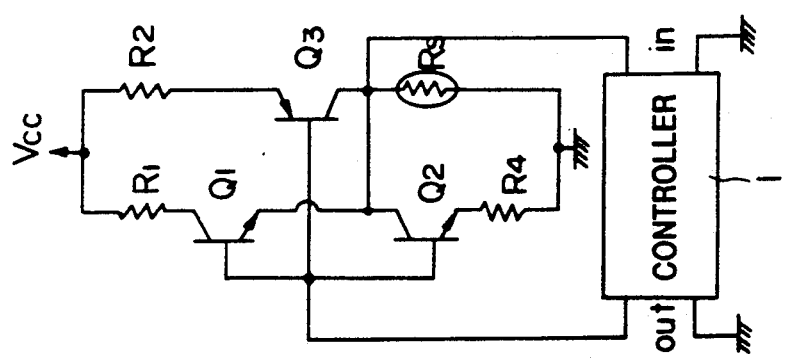
FIG. 5 is a schematic circuit diagram showing an additional embodiment of the circuit according to the invention.
Figure 4:
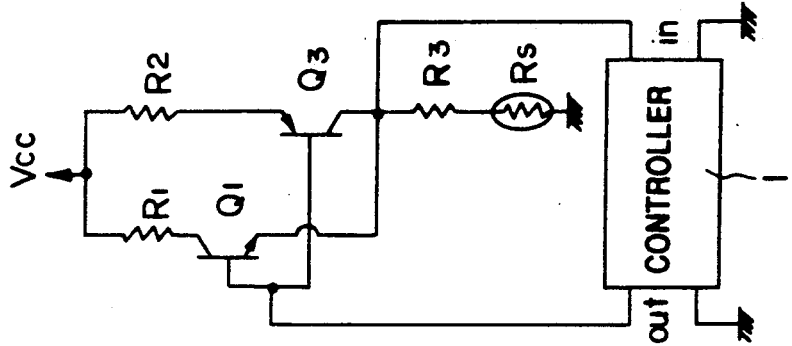
FIG. 4 is a schematic circuit diagram of another embodiment of the circuit according to the invention.

There is shown a further embodiment of the invention in FIGS. 4 to 6. In these figures, the respective circuits have the same configuration as the one in FIG. 1 except for: in FIG. 4, transistor Q2 and resistor R4 are omitted; in FIG. 5, resistor R3 is omitted and the collector of transistor Q2 and one terminal of sensor RS are directly connected to the input of controller 1; and in FIG. 6, transistor Q2 and resistors R3 and R4 are omitted to connect one terminal of sensor RS directly to the input of controller 1. With the circuits of FIGS. 4 to 6, it is possible to obtain the same effect as is in FIG. 1 by appropriately adjusting the respective divider resistors R1 and R2.

It will be understood that the above description of the invention is susceptible to various modification, changes and adaptations, and the same are intended to be comprehended within the meaning and range of equivalents of the appended claims.

What is claimed is:

1. A system for checking whether the operation of a sensor is normal, comprising:
    (a) a sensor;
    (b) a checking circuit coupled to said sensor having an open check mode and a sensing mode;
    (c) a controller for responding to output control signals from said checking circuit by generating a first output control signal to switch said checking circuit to said open check mode and a second output control signal to switch said checking circuit to said sensing mode;
    (d) an open check mode transistor electrically connected to said controller, said open check mode transistor being switched on in said open check mode so that:
        (i) a first open check mode resistor is electrically connected between a power supply terminal and an input terminal to said controller;
        (ii) a second open check mode resistor is electrically connected between said input terminal to said controller and a first end of said sensor;
        (iii) a second end of said sensor is electrically connected to ground; and
        (iv) said open check mode transistor is connected in series between said first open check mode resistor and said input terminal to said controller; and
    (e) first and second sensing mode transistors electrically connected to said controller, said sensing mode transistors being switched on in said sensing mode so that:
        (i) a first end of a first sensing mode resistor is electrically connected to said input terminal to said controller;
        (ii) a second sensing mode resistor and said sensor are electrically connected in parallel between a second end of said first sensing mode resistor and ground;
        (iii) a third sensing mode resistor is electrically connected between said power supply terminal and said input terminal to said controller; and
        (iv) said sensing mode transistor are electrically connected in series with said sensing mode resistors.

2. The system as claimed in claim 1, wherein an emitter terminal of one of said sensing mode transistors and a collector terminal of said open check mode transistors are electrically connected to said sensor.

3. The system as claimed in claim 2, wherein said sensor comprises an ambient condition responsive impedance.

4. The system as claimed in claim 3, wherein said ambient condition responsive impedance comprises a thermistor.

* * * * *